United States Patent
Lee

(10) Patent No.: US 6,562,714 B1
(45) Date of Patent: May 13, 2003

(54) CONSOLIDATION METHOD OF JUNCTION CONTACT ETCH FOR BELOW 150 NANOMETER DEEP TRENCH-BASED DRAM DEVICES

(75) Inventor: Brian Lee, Hsinchu (TW)

(73) Assignee: ProMos Technologies, Inc., Hsin-chu (TW)

( * ) Notice: Subject to any disclaimer, the term of this patent is extended or adjusted under 35 U.S.C. 154(b) by 0 days.

(21) Appl. No.: 09/993,749

(22) Filed: Nov. 6, 2001

(30) Foreign Application Priority Data

Jun. 8, 2001 (CN) .......................... 90113937 A

(51) Int. Cl.[7] .......................... H01L 21/4763
(52) U.S. Cl. .................. 438/637; 438/675; 438/700
(58) Field of Search .......................... 438/301, 303, 438/279, 587, 595, 696, 254–258

(56) References Cited

U.S. PATENT DOCUMENTS 5,292,677 A * 3/1994 Dennison .................. 438/396
5,965,035 A * 10/1999 Hung et al. .................. 216/72
6,326,270 B1 * 12/2001 Lee et al. .................. 438/279

* cited by examiner

*Primary Examiner*—David Nelms
*Assistant Examiner*—Dung A Le
(74) *Attorney, Agent, or Firm*—George O. Saile; Stephen B. Ackerman; Rosemary L. S. Pike

(57) ABSTRACT

A consolidated junction contact etch in the fabrication of a DRAM integrated circuit device is described. Semiconductor device structures are provided in and on a substrate wherein the substrate is divided into an active area and a periphery area. The semiconductor device structures are covered with an etch stop layer. A dielectric layer is deposited over the etch stop layer. The dielectric layer is concurrently etched through in the active area to form bit line contact openings, in the periphery area to form substrate contact openings, and to form gate contact openings wherein the etching stops at the etch stop layer. The etch stop layer is etched into to a lesser extent through the substrate contact openings and the bit line contact openings than through the gate contact openings. Then, the etch stop layer is etched through using a directional etch selective to the etch stop layer. The bit line contact openings, substrate contact openings, and gate contact openings are filled with a conducting layer to complete formation of contacts in the fabrication of a DRAM integrated circuit device.

23 Claims, 4 Drawing Sheets

CONSOLIDATION METHOD OF JUNCTION CONTACT ETCH FOR BELOW 150 NANOMETER DEEP TRENCH-BASED DRAM DEVICES

BACKGROUND OF THE INVENTION (1) Field of the Invention

The present invention relates to the fabrication of integrated circuit devices, and more particularly, to a method of fabricating deep trench DRAM devices in the fabrication of integrated circuits.

(2) Description of the Prior Art

In the fabrication of integrated circuit devices, deep trench (DT)-based dynamic random access memory (DRAM) devices require certain integration practices. It has been customary to separate the contact etches in the array area from the contact etches in the periphery. Different fill materials (polysilicon in the array area and tungsten in the periphery, for example) and different contact methods (diffusion contact in the array area and implant contact in the periphery) are reasons for the separation. However, in DRAM devices with a design rule of less than 150 nm, a low resistivity material is required for an array contact, especially for those using a deep trench as a storage node. Thus, polysilicon is no longer an attractive option for the contact in the array area because of its high resistivity, especially in the ease of deep trench based DRAM design.

It has also been customary to combine the bit substrate contact (CS) etch with the contact to gate etch because of their close proximity in the array area. For example, a self-aligned contact (SAC) process has been used for the bit line contact (CB) etch in the array area while the contact to substrate and the gate contact etch in the periphery have been etched together with a moderate oxide-to-nitride etch selectivity (<3:1) etch method. The moderate etch selectivity recipe has been chosen partly because it must etch through a nitride capping layer on top of the gate. However, this moderate etching selectivity, especially of oxide to nitride, puts the future manufacturing process in jeopardy due to insufficient overlay control between the gate contact and the contact to the substrate in the periphery. Overlay control becomes more difficult as the ground rule (or critical dimension of the gate) shrinks especially for those devices having a ground rule of less than 0.17 $\mu$m. The protection for gate conductor (GC) against CS short becomes even weaker with insufficient selectivity. A proximity of the CS to the gate is a dangerous event. Deleterious short channel effect, threshold voltage roll-off (lowering of the threshold voltage as gate length decreases), junction leakage, and lowering of the effective saturation current can result. This is especially true for implanted contact devices such as NFET support devices.

A number of patents have addressed aspects etching selectivity. U.S. Pat. No. 5,718,800 to Juengling teaches selective contact etching using a nitride cap layer. U.S. Pat. No. 5,292,677 to Dennison discloses a single etch stop layer for all contacts wherein all contacts are opened together. U.S. Pat. No. 6,136,643 to Jeng et al, U.S. Pat. No. 6,133,153 to Marquez et al, and U.S. Pat. No. 5,965,035 to Hung et al show contact etches that are selective to oxide with respect to nitride. U.S. Pat. No. 6,008,104 to Schrems shows a DRAM process with several selective etches.

SUMMARY OF THE INVENTION

Accordingly, it is a primary object of the present invention to provide an effective and very manufacturable method of DRAM formation in the fabrication of integrated circuits.

It is a further object of the invention to provide a consolidated junction contact etch for DRAM device fabrication.

In accordance with the objects of the invention, a consolidated junction contact etch in the fabrication of a DRAM integrated circuit device is achieved. Semiconductor device structures are provided in and on a substrate wherein the substrate is divided into an array area and a periphery area. The semiconductor device structures are covered with an etch stop layer. A dielectric layer is deposited over the etch stop layer. The dielectric layer is concurrently etched through in the array area to form bit line contact openings, in the periphery area to form substrate contact openings, and to form gate contact openings wherein the etching stops at the etch stop layer. The etch stop layer is etched into to a lesser extent through the substrate contact openings and the bit line contact openings than through the gate contact openings. Then, the etch stop layer is etched through using a directional etch selective to the substrate layer (silicon). The bit line contact openings, substrate contact openings, and gate contact openings are cleaned by a wet process and filled with a conducting layer to complete formation of contacts in the fabrication of a DRAM integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention provides a consolidated junction contact etch process in the fabrication of DRAM integrated circuit devices. The method of the present invention is particularly useful for deep trench DRAM devices. However, it will be understood by those skilled in the art that the process of the present invention should not be limited to the application herein illustrated, but can be applied and extended to other applications, including, for example, Ferro-electric RAM (FeRAM) or magnetic RAM (MRAM).

Figure 1:
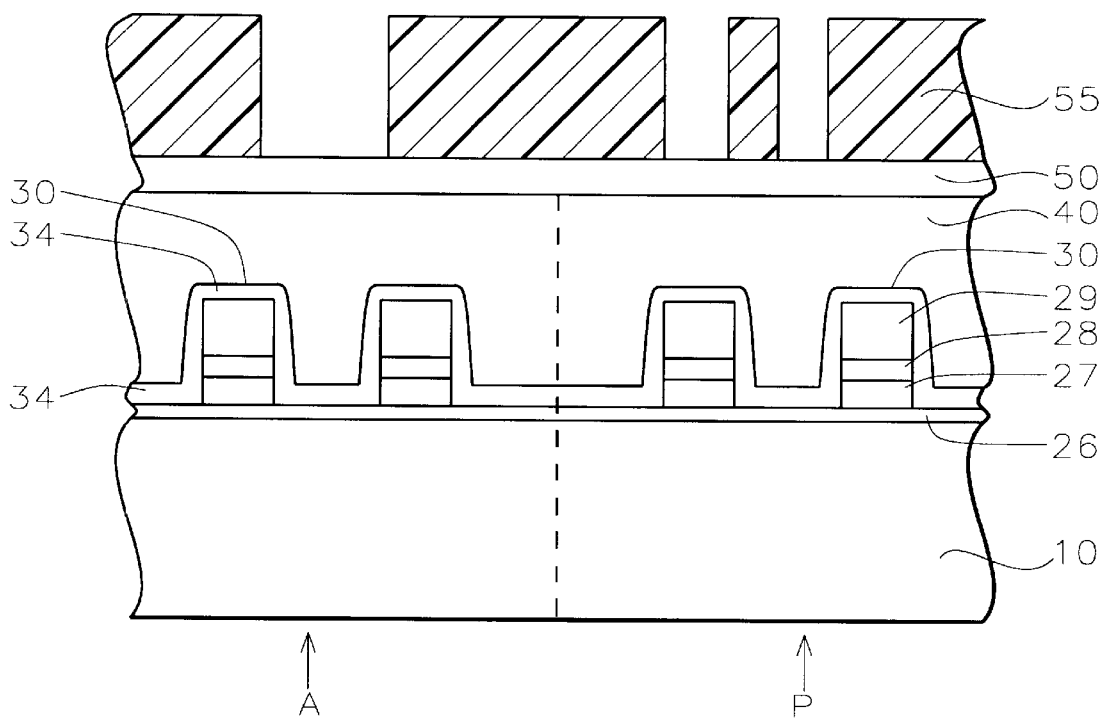
FIGS. 1 through 6 are cross-sectional representations of a preferred embodiment of the present invention.

Referring now more particularly to FIG. 1, there is shown a semiconductor substrate 10. Gate conductor (GC) and interconnection lines 30 have been formed overlying the semiconductor substrate. For example, the interconnection lines or gate conductor 30 are formed overlying a gate oxide layer 26. The gate conductor may comprise a first layer of polysilicon 27 having a thickness of between about 800 and 1000 Angstroms, a second layer of silicide 28 such as tungsten silicide having a thickness of between about 650 and 1000 Angstroms, and a third layer of nitride 29 such as silicon nitride having a thickness of between about 1600 and 2000 Angstroms. Now, a silicon nitride frame 34 is deposited conformally overlying the gates 30 and the screen oxide layer 26 between the gates. The silicon nitride frame 34 has a thickness of between about 200 and 400 Angstroms.

Inter-layer dielectric layer 40 is blanket deposited over the semiconductor device structures. This layer may comprise silicon dioxide, borophosphotetraethoxysilane (BP-TEOS) oxide, borophosphosilicate glass (BPSG), phosphosilicate glass (PSG), or a combination of BPSG and silicon dioxide, and so on, and may be one or more layers. The total thickness of the layer 40 is between about 8000 and 10,000 Angstroms. The top of the inter-layer dielectric layer 40 may be planarized, for example by reflowing of the dielectric material, etchback, or chemical mechanical polishing (CMP), or the like. The interlayer dielectric layer 40 has a thickness over the gates 30 of between about 2500 and 4500 Angstroms.

Now, an anti-reflective coating (ARC) layer 50 may be deposited over the planarized interlayer dielectric layer 40. For example, the ARC layer may comprise an organic or dielectric ARC material having a thickness of between about 60 and 120 Angstroms.

Now, a photoresist mask 55 is formed over the surface of the wafer. The mask has openings for the bit line contact (CB) opening, the substrate contact (CS) opening, and the gate contact (GC) opening.

The consolidation junction contact etch of the present invention makes it possible to consolidate all the junction contact etch steps using one mask. A highly selective self-aligned contact (SAC) etch is used for both the bit line contact openings in the array area A and the substrate contact openings in the periphery P as well as for the gate contact opening. The high etch selectivity of oxide to nitride will assure a healthy protection of the gate sidewall against unintended misalignment between a gate and a substrate contact opening.

Figure 2:
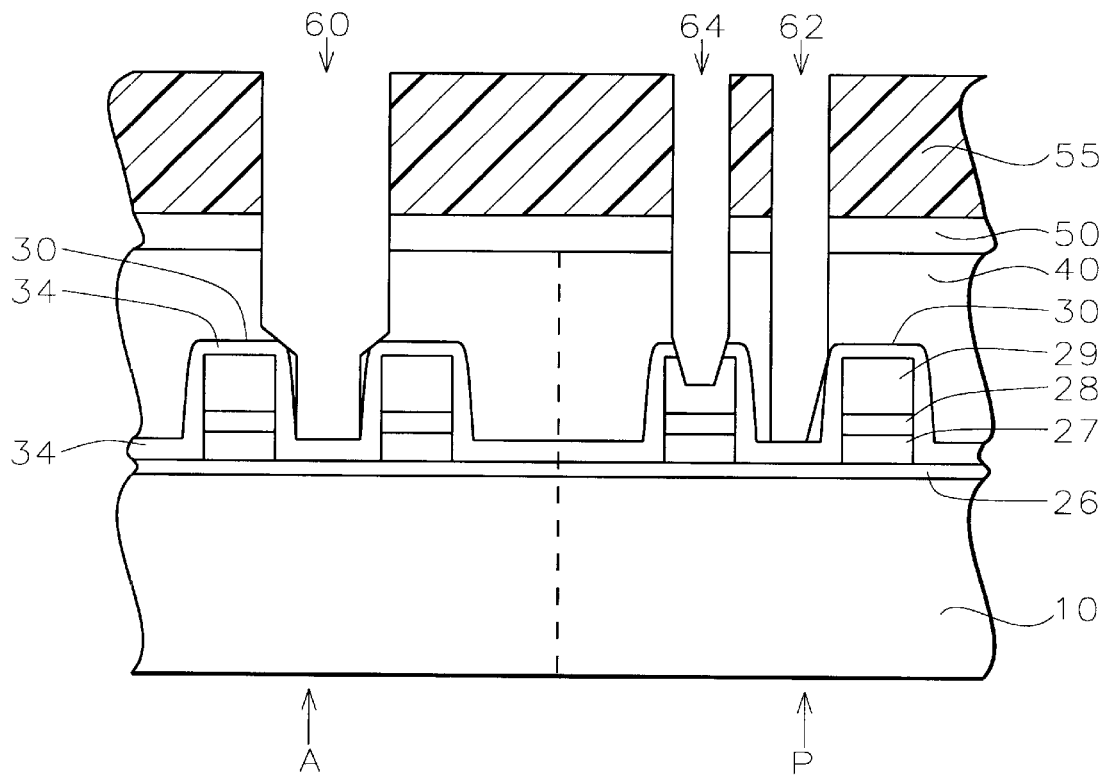

Referring now to FIG. 2, a self-aligned contact etch is performed selective to oxide with respect to nitride. Preferably, the etching gases include $C_4F_8$ and CO or $C_5F_8$ or $C_4F_6$ along with $O_2$ and Ar. This etch step stops at the silicon nitride frame 34 at the source/drain contacts, as shown at CB 60 and CS 62. Also in this etch step, a part of the capping silicon nitride layer 29 on top of a gate will be etched through opening 64. The oxide to nitride selectivity is a function of aspect ratio; the higher the aspect ratio, the higher the selectivity. This somewhat unexpected fact can be explained by the ion to neutral ratio as a function of aspect ratio which allows fewer ions to reach to a deeper bottom due to electrostatic charging effect followed by an ion deflection. It is preferred to have an oxide to nitride selectivity of more than about 10. In this invention, the process is designed so that about 40 to 60% of the silicon nitride capping layer 29 through contact hole 64 will be etched into while less than 10% of the nitride layer on the bottom of the contact holes 60 and 62 will be etched. To control the overetch into the cap silicon nitride layer, it is desirable to use a selective ARC to oxide etch process to overcome any process non-uniformity. The selective ARC open etch is performed using a non-fluorine containing chemistry such as $N_2+O_2$ or $Cl_2$ at low bias voltage. The ARC open etch is followed by the SAC etch described above.

Figure 3:
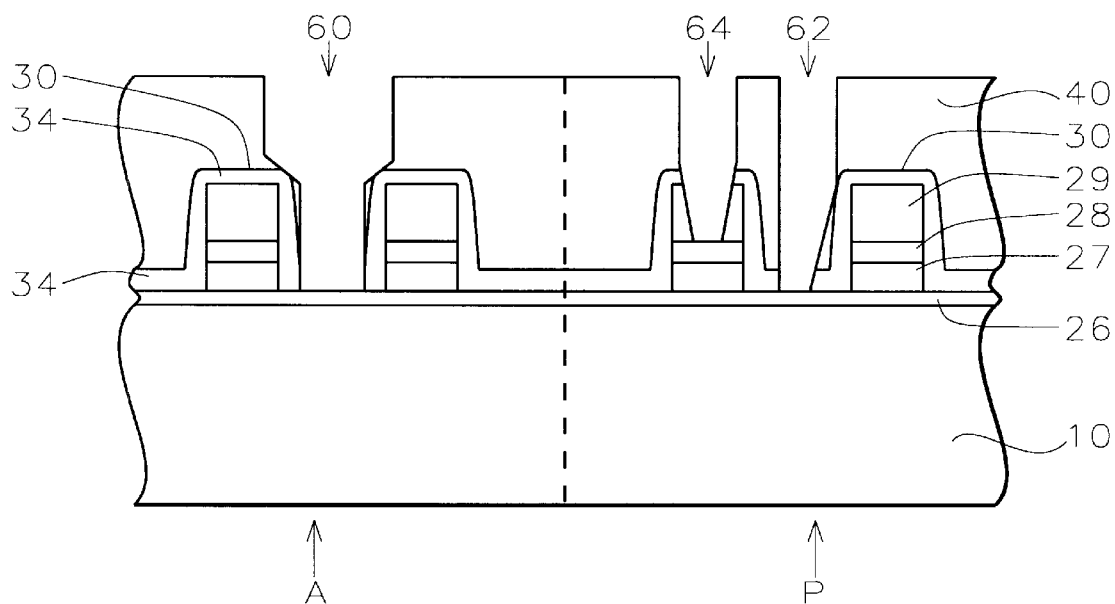

Referring now to FIG. 3, the resist mask and the ARC layer are stripped after the ARC open and oxide etches. Now, the silicon nitride layer 34 at the bottom of the contact holes 60 and 62 is etched using a differential etch. This etching step uses $CHF_3$ and $CH_2F_2$ gases and is selective to nitride with respect to oxide. This is a highly anisotropic nitride etch in order to protect the nitride sidewalls 34. That is, the transverse nitride etch rate should be at least three times greater than the lateral etch rate. It is important to optimize the ion energy that is mainly controlled by RF self-bias such that it does not cause notching or undercut.

It is important that the thickness of the etch stop frame be enough to compensate for erosion during the contact etch steps. The thickness of the silicon nitride layer and its topological distribution is determined by etch design. A thick silicon nitride frame is employed. It should be noted that an excessive silicon nitride layer thickness will make the post process difficult by making the contact opening too small. The silicon nitride frame should have a thickness of between about 200 and 400 Angstroms.

Figure 4:
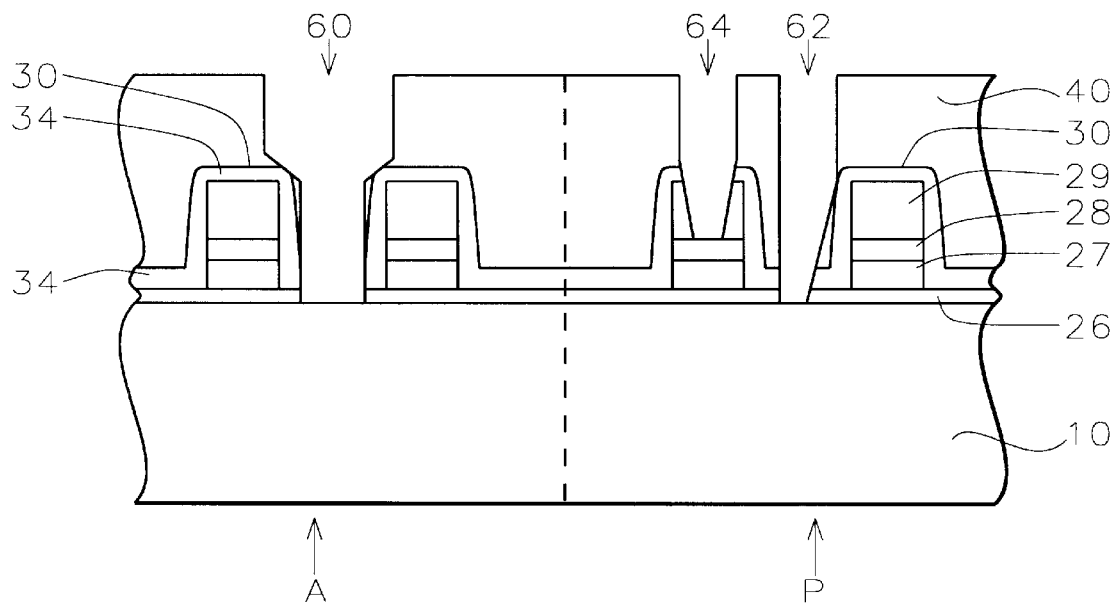

Referring now to FIG. 4, the remaining gate oxide layer 26 within the contact openings 60 and 62 is removed preferably by a wet etch. An in-situ dry etch may alternatively be used.

Figure 5:
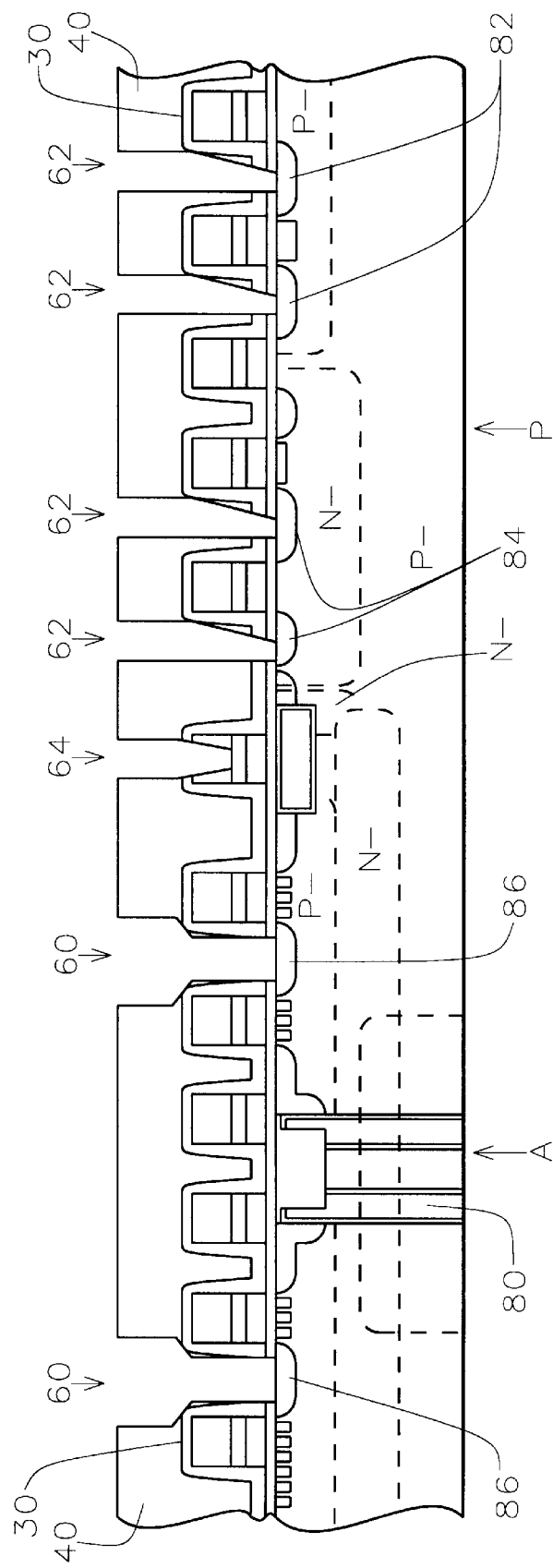

FIG. 5 shows an expanded view of the integrated circuit of the present invention. Deep trench DRAM device 80 is shown having been previously formed within the substrate 10 underlying the gate electrodes and interconnection lines 30. Ion implantations are made in turn, using blocking masks as necessary, to form CS P junctions 82, CS N junctions 84, and bit line diffusions 86.

Figure 6:
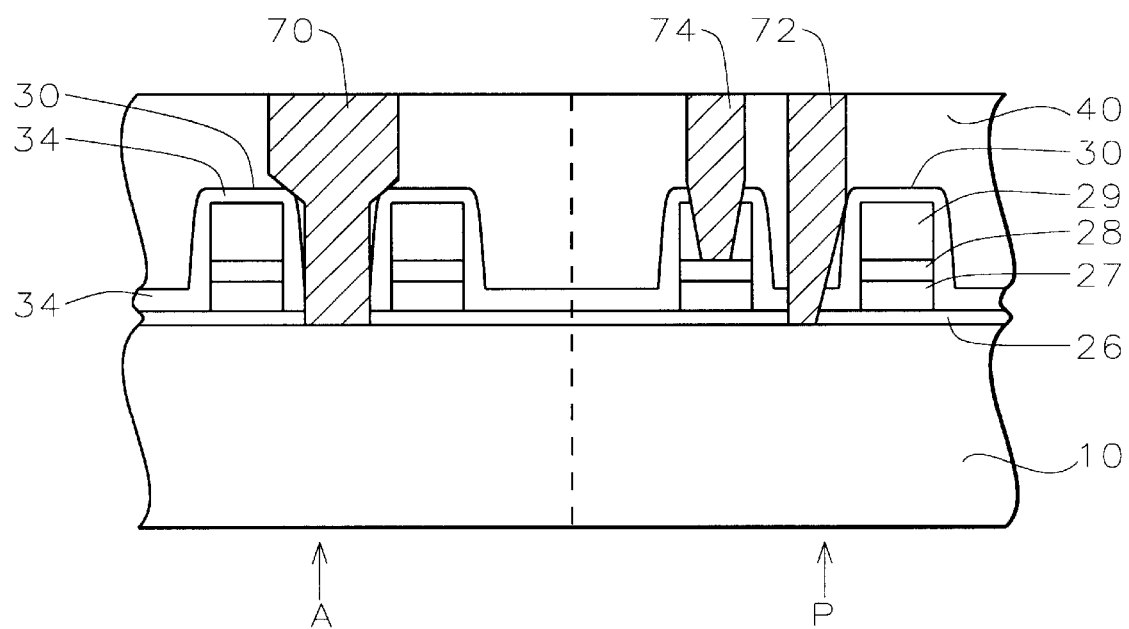

Returning now to the close-up view of FIG. 6, the contacts are completed by filling the contact openings 60, 62, and 64 with a metal layer 70, 72, and 74, respectively. The metal may be tungsten, titanium, aluminum, tungsten silicon, or the like. A barrier metal layer, not shown, such as titanium/titanium nitride may be deposited underlying the metal layer.

Processing continues as is conventional in the art with higher levels of metallization.

The process of the present invention provides a combined etching scheme which makes it possible to consolidate all the junction contact etch steps using only one mask. The etches use a SAC etch scheme and utilize aspect ratio development etch rate characteristics during the etch stop layer etch.

While the invention has been particularly shown and described with reference to the preferred embodiments thereof, it will be understood by those skilled in the art that various changes in form and details may be made without departing from the spirit and scope of the invention.

What is claimed is:

1. A method of forming contacts in the fabrication of an integrated circuit comprising:

providing semiconductor device structures in and on a substrate wherein said substrate is divided into an array area and a periphery area;

covering said semiconductor device structures with an etch stop layer;

depositing a dielectric layer overlying said etch stop layer;

concurrently first etching through said dielectric layer in said array area to form bit line contact openings and etching through said dielectric layer in said periphery area to form substrate contact openings and through said dielectric layer to form gate contact openings wherein said etching stops at said etch stop layer;

second etching through said etch stop layer using a directional etch selective to said substrate wherein said second etching etches nitride transversely at least three times faster than laterally; and filling said bit line contact openings, said substrate contact openings, and said gate contact openings with a conducting layer to complete said forming contacts in the fabrication of said integrated circuit device.

2. The method according to claim 1 wherein said semiconductor device structures include gate electrodes and source and drain regions.

3. The method according to claim 1 further comprising forming deep trench DRAM devices in said substrate.

4. The method according to claim 1 wherein said etch stop layer comprises silicon nitride.

5. The method according to claim 1 wherein said etch stop layer has a thickness of between about 200 and 400 Angstroms.

6. The method according to claim 1 wherein said step of etching to form all of said contact openings is a self-aligned contact etch.

7. The method according to claim 1 wherein said first etching comprises a selective oxide with respect to nitride etch.

8. The method according to claim 1 wherein said second etching comprises $CHF_3$ and $CH_2F_2$ gases.

9. A method of forming contacts in the fabrication of a DRAM integrated circuit comprising:

providing semiconductor device structures in and on a substrate wherein said substrate is divided into an array area and a periphery area;

covering said semiconductor device structures with an etch stop layer;

depositing a dielectric layer overlying said etch stop layer;

concurrently first etching through said dielectric layer in said array area to form bit line contact openings and etching through said dielectric layer in said periphery area to form substrate contact openings and through said dielectric layer to form gate contact openings wherein said etching stops at said etch stop layer wherein said etch stop layer is etched into to a lesser extent through said substrate contact openings and said bit line contact openings than through said gate contact openings;

second etching through said etch stop layer using a directional etch selective to said substrate wherein said second etching and etches nitride transversely at least three times faster than laterally;

filling said bit line contact openings, said substrate contact openings, and said gate contact openings with a conducting layer to complete said forming contacts in the fabrication of said DRAM integrated circuit device.

10. The method according to claim 9 wherein said semiconductor device structures include gate electrodes and source and drain regions.

11. The method according to claim 9 further comprising forming deep trench DRAM devices in said substrate.

12. The method according to claim 9 wherein said etch stop layer comprises silicon nitride.

13. The method according to claim 9 wherein said etch stop layer has a thickness of between about 200 and 400 Angstroms.

14. The method according to claim 9 wherein said step of etching to form all of said contact openings is a self-aligned contact etch.

15. The method according to claim 9 further comprising depositing an anti-reflective coating (ARC) layer overlying said dielectric layer wherein said first etching comprises an etch non-selective ARC to oxide using gases selected from the group consisting of: $N_2$ and $O_2$ gases or $Cl_2$ gas at low bias voltage followed by an etch selective oxide to nitride using gases selected from the group consisting of: $C_4F_8$ and CO gases, $C_5F_8$ gas, and $C_4F_6$ gas.

16. The method according to claim 9 wherein said second etching comprises $CHF_3$ and $CH_2F_2$ gases.

17. A method of forming contacts in the fabrication of a DRAM integrated circuit comprising:

providing gate electrodes and interconnection lines in and on a substrate wherein a nitride capping layer covers each of said gate electrodes;

covering said gate electrodes and said interconnection lines with a nitride etch stop layer;

depositing a dielectric layer overlying said nitride etch stop layer;

concurrently first etching through said dielectric layer to form contact openings to said substrate and to form contact openings to said gate electrodes wherein said etching stops at said nitride etch stop layer and wherein said nitride etch stop layer and capping nitride layer overlying said gate electrodes are etched into between about 40 and 60% and wherein said nitride etch stop layer overlying said substrate is etched into less than 10%;

second etching through said nitride etch stop layer using a directional etch selective to said substrate; and filling said contact openings with a conducting layer to complete said forming contacts in the fabrication of said DRAM integrated circuit device.

18. The method according to claim 17 wherein said second etching comprises etching with gases selected from the group consisting of: $CHF_3$ and $CH_2F_2$ and wherein said second etching is selective to nitride with respect to oxide and wherein said second etching has a transverse etch rate of at least three times its lateral etch rate.

19. The method according to claim 17 further comprising forming deep trench DRAM devices in said substrate.

20. The method according to claim 17 wherein said nitride capping layer has a thickness of between about 1600 and 2000 Angstroms.

21. The method according to claim 17 wherein said nitride etch stop layer comprises silicon nitride and has a thickness of between about 200 and 400 Angstroms.

22. The method according to claim 17 wherein said dielectric layer comprises one or more of the group containing silicon dioxide, borophospho-tetraethoxysilane oxide, borophosphosilicate glass, and phosphosilicate glass.

23. The method according to claim 17 wherein said first etching comprises etching with gases selected from the group consisting of: $C_4F_8$ and CO, $C_5F_8$ and $C_4F_6$ and having a selectivity of oxide to nitride of more than 10%.

* * * * *